United States Patent
Metzler (10) Patent No.: US 6,537,921 B2
(45) Date of Patent: Mar. 25, 2003

(54) VERTICAL METAL OXIDE SILICON FIELD EFFECT SEMICONDUCTOR DIODES

(75) Inventor: Richard A. Metzler, Mission Viejo, CA (US)

(73) Assignee: VRAM Technologies, LLC, Costa Mesa, CA (US)

( * ) Notice: Subject to any disclaimer, the term of this patent is extended or adjusted under 35 U.S.C. 154(b) by 0 days.

(21) Appl. No.: 09/864,436

(22) Filed: May 23, 2001

(65) Prior Publication Data

US 2002/0177324 A1 Nov. 28, 2002

(51) Int. Cl.[7] ............................................... H01L 21/00
(52) U.S. Cl. ...................... 438/719; 257/288; 438/723; 438/734; 438/740
(58) Field of Search ................. 438/712, 719, 438/723, 734, 735, 737, 740, 743, 329, 380; 257/288, 324, 337, 910; 216/67, 79

(56) References Cited

U.S. PATENT DOCUMENTS

| 2,444,255 | A | 6/1948 | Hewlett |
| 3,295,030 | A | 12/1966 | Allison |
| 3,407,343 | A | 10/1968 | Fang |
| 3,427,708 | A | 2/1969 | Schütze et al. |
| 3,458,798 | A | 7/1969 | Fang et al. |
| 3,566,215 | A | 2/1971 | Heywang |
| 3,586,925 | A | 6/1971 | Collard |
| 3,617,824 | A | 11/1971 | Shinoda et al. |
| 3,619,737 | A | 11/1971 | Chiu |

(List continued on next page.)

FOREIGN PATENT DOCUMENTS

| DE | 32 19 888 A1 | 1/1983 |
| DE | 196 05 633 A1 | 12/1996 |
| JP | 61-156882 | 7/1986 |
| JP | 63-054762 | 3/1988 |
| JP | 63-205927 | 8/1988 |
| JP | 5-109883 | 4/1993 |
| WO | WO98/33218 | 7/1998 |

OTHER PUBLICATIONS

Wolf, Stanley et al., "Silicon Processing for the VLSI Era", 1986, pp. 321–327, Lattice Press, Sunset Beach, California.

Maleis, Hanafy E., "Full–Wave Rectifier for CMOS IC Chip", United States Statutory Invention Registration No. H64, May 6, 1986.

Kim, Han–Soo et al., "Breakdown Voltage Enhancement of the p–n Junction by Self–Aligned Double Diffusion Process Through a Tapered SiO2 Implant Mask", IEEE Electron Device Letters, Sep. 16, 1995, vol. 16, No. 9, pp. 405–407.

Yano, Koji et al., "Application of a Junction Field Effect Transistor Structure to a Low Loss Diode", Jpn. J. Appl. Phys. Mar. 1997, pp. 1487–1493, vol. 36, Part 1, No. 3B.

*Primary Examiner*—William A. Powell
(74) *Attorney, Agent, or Firm*—Blakely, Sokoloff, Taylor & Zafman LLP (57) ABSTRACT

The present invention includes methods and apparatus as described in the claims. Briefly, semiconductor diodes having a low forward conduction voltage drop, a low reverse leakage current, a high voltage capability and avalanche energy capability, suitable for use in integrated circuits as well as for discrete devices are disclosed. The semiconductor diodes are diode configured vertical cylindrical metal oxide semiconductor field effect devices having one diode terminal as the common connection between the gates and drains of the vertical cylindrical metal oxide semiconductor field effect devices, and one diode terminal as the common connection with the sources of the vertical cylindrical metal oxide semiconductor field effect devices. The method of manufacturing the vertical cylindrical metal oxide semiconductor field effect devices is disclosed. Various device terminations can be employed to complete the diode devices. Various embodiments are disclosed.

20 Claims, 4 Drawing Sheets

U.S. PATENT DOCUMENTS

| | | |
|---|---|---|
| 3,749,987 A | 7/1973 | Anantha |
| 3,769,109 A | 10/1973 | MacRae et al. |
| 3,864,819 A | 2/1975 | Ying |
| 3,935,586 A | 1/1976 | Landheer et al. |
| 3,943,547 A | 3/1976 | Nagano et al. |
| 3,988,765 A | 10/1976 | Pikor |
| 4,019,248 A | 4/1977 | Black |
| 4,045,250 A | 8/1977 | Dingwall |
| 4,099,260 A | 7/1978 | Lynes et al. |
| 4,104,086 A | 8/1978 | Bondur et al. |
| 4,138,280 A | 2/1979 | Rodov |
| 4,139,880 A | 2/1979 | Ulmer et al. |
| 4,139,935 A | 2/1979 | Bertin et al. |
| 4,140,560 A | 2/1979 | Rodov |
| 4,153,904 A | 5/1979 | Tasch, Jr. et al. |
| 4,246,502 A | 1/1981 | Kubinec |
| 4,318,751 A | 3/1982 | Horng |
| 4,330,384 A | 5/1982 | Okudaira et al. |
| 4,340,900 A | 7/1982 | Goronkin |
| 4,372,034 A | 2/1983 | Bohr |
| 4,403,396 A | 9/1983 | Stein |
| 4,423,456 A | 12/1983 | Zaidenweber |
| 4,508,579 A | 4/1985 | Goth et al. |
| 4,533,988 A | 8/1985 | Daly et al. |
| 4,534,826 A | 8/1985 | Goth et al. |
| 4,579,626 A | 4/1986 | Wallace |
| 4,586,075 A | 4/1986 | Schwenk et al. |
| 4,638,551 A | 1/1987 | Einthoven |
| 4,666,556 A | 5/1987 | Fulton et al. |
| 4,672,736 A | 6/1987 | Westermeier |
| 4,672,738 A | 6/1987 | Stengl et al. |
| 4,680,601 A | 7/1987 | Mitlehner et al. |
| 4,739,386 A | 4/1988 | Tanizawa |
| 4,742,377 A | 5/1988 | Einthoven |
| 4,745,395 A | 5/1988 | Robinson |
| 4,757,031 A | 7/1988 | Kuhnert et al. |
| 4,774,560 A | 9/1988 | Coe |
| 4,777,580 A | 10/1988 | Bingham |
| 4,808,542 A | 2/1989 | Reichert et al. |
| 4,811,065 A | 3/1989 | Cogan |
| 4,822,757 A | 4/1989 | Sadamori |
| 4,857,985 A | 8/1989 | Miller |
| 4,875,151 A | 10/1989 | Ellsworth et al. |
| 4,900,692 A | 2/1990 | Robinson |
| 4,903,189 A | 2/1990 | Ngo et al. |
| 4,927,772 A | 5/1990 | Arthur et al. |
| 4,974,050 A | 11/1990 | Fuchs |
| 5,038,266 A | 8/1991 | Callen et al. |
| 5,047,355 A | 9/1991 | Huber et al. |
| 5,081,509 A | 1/1992 | Kozaka et al. |
| 5,093,693 A | 3/1992 | Abbas et al. |
| 5,101,254 A | 3/1992 | Hamana |
| 5,109,256 A | 4/1992 | De Long |
| 5,132,749 A | 7/1992 | Nishibayashi et al. |
| 5,144,547 A | 9/1992 | Masamoto |
| 5,184,198 A | 2/1993 | Bartur |
| 5,225,376 A | 7/1993 | Feaver et al. |
| 5,258,640 A | 11/1993 | Hsieh et al. |
| 5,268,833 A | 12/1993 | Axer |
| 5,296,406 A | 3/1994 | Readdie et al. |
| 5,340,757 A | 8/1994 | Chantre et al. |
| 5,349,230 A | 9/1994 | Shigekane |
| 5,357,131 A | 10/1994 | Sunami et al. |
| 5,365,102 A | 11/1994 | Mehrotra et al. |
| 5,396,087 A | 3/1995 | Baliga |
| 5,426,325 A | 6/1995 | Chang et al. |
| 5,430,323 A | 7/1995 | Yamazaki et al. |
| 5,469,103 A | 11/1995 | Shigekane |
| 5,475,245 A | 12/1995 | Kudo et al. |
| 5,475,252 A | 12/1995 | Merrill et al. |
| 5,479,626 A | 12/1995 | Bindloss et al. |
| 5,506,421 A | 4/1996 | Palmour |
| 5,510,641 A | 4/1996 | Yee et al. |
| 5,536,676 A | 7/1996 | Cheng et al. |
| 5,780,324 A | 7/1998 | Tokura et al. |
| 5,818,084 A | 10/1998 | Williams et al. |
| 5,825,079 A | 10/1998 | Metzler et al. |
| 5,886,383 A | 3/1999 | Kinzer |
| 5,907,181 A | 5/1999 | Han et al. |
| 6,002,574 A | 12/1999 | Metzler et al. |
| 6,083,846 A * | 7/2000 | Fulford et al. .......... 438/719 X |
| 6,186,408 B1 | 2/2001 | Rodov et al. |

* cited by examiner

VERTICAL METAL OXIDE SILICON FIELD EFFECT SEMICONDUCTOR DIODES

BACKGROUND OF THE INVENTION

1. Field of the Invention

The present invention generally relates to semiconductor devices and fabrication of the same. The present invention more particularly relates to semiconductor diodes and their methods of fabrication.

2. Background Information

Semiconductor devices of various kinds are well known in the prior art. Because the present invention relates to semiconductor diodes and how they are fabricated, the focus of this section will be semiconductor diodes.

Semiconductor diodes are widely used in electronic circuits for various purposes. The primary purpose of such semiconductor diodes is to provide conduction of current in a forward direction in response to a forward voltage bias, and to block conduction of current in the reverse direction in response to a reverse voltage bias. This rectifying function is widely used in such circuits as power supplies of various kinds as well as in many other electronic circuits.

In typical semiconductor diodes, conduction in the forward direction is limited to leakage current values until the forward voltage bias reaches a characteristic value for the particular type of semiconductor device. By way of example, silicon pn junction diodes don't conduct significantly until the forward bias voltage is at least approximately 0.7 volts. Many silicon Schottky diodes, because of the characteristics of the Schottky barrier, can begin to conduct at lower voltages, such as 0.4 volts. Germanium pn junction diodes have a forward conduction voltage drop of approximately 0.3 volts at room temperature. However, the same are currently only rarely used, not only because of their incompatibility with silicon integrated circuit fabrication, but also even as a discrete device because of temperature sensitivity and other undesirable characteristics thereof.

In some applications, diodes are used not for their rectifying characteristics, but rather to be always forward biased so as to provide their characteristic forward conduction voltage drop. For instance, in integrated circuits, diodes or diode connected transistors are frequently used to provide a forward conduction voltage drop substantially equal to the base-emitter voltage of another transistor in the circuit. While certain embodiments of the present invention may find use in circuits of this general kind, such use is not a primary objective thereof.

In circuits which utilize the true rectifying characteristics of semiconductor diodes, the forward conduction voltage drop of the diode is usually a substantial disadvantage. By way of specific example, in a DC to DC step-down converter, a transformer is typically used wherein a semiconductor switch controlled by an appropriate controller is used to periodically connect and disconnect the primary of the transformer with a DC power source. The secondary voltage is connected to a converter output, either through a diode for its rectifying characteristics, or through another semiconductor switch. The controller varies either the duty cycle or the frequency of the primary connection to the power source as required to maintain the desired output voltage. If a semiconductor switch is used to connect the secondary to the output, the operation of this second switch is also controlled by the controller.

Use of a semiconductor switch to couple the secondary to the output has the advantage of a very low forward conduction voltage drop, though has the disadvantage of requiring careful control throughout the operating temperature range of the converter to maintain the efficiency of the energy transfer from primary to secondary. The use of a semiconductor diode for this purpose has the advantage of eliminating the need for control of a secondary switch, but has the disadvantage of imposing the forward conduction voltage drop of the semiconductor diode on the secondary circuit. This has at least two very substantial disadvantages. First, the forward conduction voltage drop of the semiconductor diode device can substantially reduce the efficiency of the converter. For instance, newer integrated circuits commonly used in computer systems are designed to operate using lower power supply voltages, such as 3.3 volts, 3 volts and 2.7 volts. In the case of a 3 volt power supply, the imposition of a 0.7 volt series voltage drop means that the converter is in effect operating into a 3.7 volt load, thereby limiting the efficiency of the converter to 81%, even before other circuit losses are considered.

Second, the efficiency loss described above represents a power loss in the diode, resulting in the heating thereof. This limits the power conversion capability of an integrated circuit converter, and in many applications requires the use of a discrete diode of adequate size, increasing the overall circuit size and cost.

Another commonly used circuit for AC to DC conversion is the full wave bridge rectifier usually coupled to the secondary winding of a transformer having the primary thereof driven by the AC power source. Here two diode voltage drops are imposed on the peak DC output, making the circuit particularly inefficient using conventional diodes, and increasing the heat generation of the circuit requiring dissipation through large discrete devices, heat dissipating structures, etc. depending on the DC power to be provided.

Therefore, it would be highly advantageous to have a semiconductor diode having a low forward conduction voltage drop for use as a rectifying element in circuits wherein the diode will be subjected to both forward and reverse bias voltages from time to time. While such a diode may find many applications in discrete form, it would be further desirable for such a diode to be compatible with integrated circuit fabrication techniques so that the same could be realized in integrated circuit form as part of a much larger integrated circuit. Further, while reverse current leakage is always undesirable and normally must be made up by additional forward conduction current, thereby decreasing circuit efficiency, reverse current leakage can have other and more substantial deleterious affects on some circuits. Accordingly it would also be desirable for such a semiconductor diode to further have a low reverse bias leakage current.

In many applications it is required that the diode be put across a coil such as a transformer. In these instances it is possible for a reverse voltage to be applied to the diode which will force it into reverse breakdown, specifically into a junction avalanche condition. This is particularly true in DC to DC converters which use a rapidly changing waveform to drive transformer coils which are connected across diode bridges. In these applications a specification requirement for "Avalanche Energy" capability is a parameter normally included in the data sheets. The avalanche energy capability of a diode is a significant factor for a designer of such circuits. The avalanche energy capability determines how much design margin a designer has when designing a semiconductor diode into a circuit. The larger the number of avalanche energy capability the more design flexibility a circuit designer has.

The avalanche energy capability is a measure of the diode's capability to absorb the energy from the coil, where energy $E=(\frac{1}{2})*I^2*L$, without destroying the diode. These requirements are typically on the order of tens of millijoules. A key factor in the ability of a diode to nondestructively dissipate this energy is the amount of junction area which dissipates the energy i.e., the area of the junction which actually conducts during avalanche. High avalanche energy capability of a semiconductor diode improves its utilization.

At the same time, it is desirable to lower the cost of semiconductor diodes by reducing their size and by improving their methods of fabrication.

BRIEF SUMMARY OF THE INVENTION

The present invention includes methods and apparatus as described in the claims. Briefly, semiconductor diodes having a low forward conduction voltage drop, a low reverse leakage current, a high voltage capability and avalanche energy capability, suitable for use in integrated circuits as well as for discrete devices are disclosed. The semiconductor diodes are diode configured vertical cylindrical metal oxide semiconductor field effect devices having one diode terminal as the common connection between the gates and drains of the vertical cylindrical metal oxide semiconductor field effect devices, and one diode terminal as the common connection with the sources of the vertical cylindrical metal oxide semiconductor field effect devices. The method of manufacturing the vertical cylindrical metal oxide semiconductor field effect devices is disclosed. Various device terminations can be employed to complete the diode devices. Various embodiments are disclosed.

Other aspects and features of the present invention will become apparent to those ordinarily skilled in the art upon review of the following description of specific embodiments of the invention in conjunction with the accompanying claims and figures.

BRIEF DESCRIPTION OF THE DRAWINGS

The features and advantages of the present invention will become apparent from the following detailed description of the present invention in which:

FIGS. 3A–3N are cross-sectional views illustrating steps in an exemplary process for fabricating the diode connected vertical metal oxide semiconductor field effect devices of the present invention.

Like reference numbers and designations in the drawings indicate like elements providing similar functionality.

DETAILED DESCRIPTION OF THE PRESENT INVENTION

Figure 1:
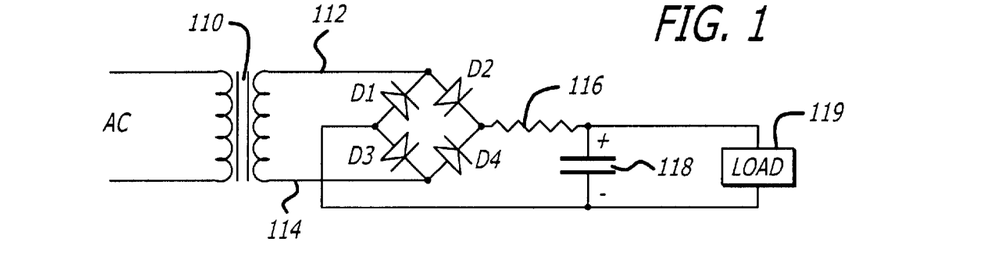
FIG. 1 is a circuit diagram for a well known AC to DC converter using a full wave bridge rectifier in which the present invention may be used.

First referring to FIG. 1, a circuit diagram for a well known AC to DC converter using a full wave bridge rectifier in which the present invention may be used may be seen. In such circuits, a transformer 110 is used to provide DC isolation between the primary and secondary circuits and frequently to provide an AC voltage step-up or step-down to the full wave bridge, comprised of diodes D1, D2, D3 and D4. When the secondary lead 112 is sufficiently positive with respect to secondary lead 114, diode D2 will conduct through resister 116 to charge or further charge capacitor 118 and to provide current to load 119, which current returns to lead 114 of the transformer through diode D3. Similarly, during the other half cycle of the AC input voltage, when the voltage on secondary lead 114 is sufficiently positive with respect to secondary lead 112, diode D4 will conduct to provide current through resistor 116 to charge capacitor 118 and to provide current to load 119, with the capacitor and load currents being returned to the secondary lead 112 through diode D1. Thus it may be seen that each time current is delivered from the full wave bridge of diodes D1 through D4 to the output of the bridge, two diode voltage drops are imposed in series with that output. Further, since any pair of diodes conduct only when the voltage across the secondary of the transformer 110 exceeds the voltage across capacitor 118 by two diode voltage drops, it is clear that current is delivered to the output of the bridge only during a fraction of the time, namely when the transformer secondary voltage is at or near a positive or negative peak.

The circuit of FIG. 1 is merely exemplary of the type of circuit in which the present invention is intended to be used. These circuits may be characterized as circuits wherein the diode will be subjected to both positive (forward) and negative (reverse) differential voltages across the two diode connections and the function of the diode is a rectifying function to provide a DC or rectified current output. This is to be distinguished from applications wherein the desired function of a diode is to provide a voltage reference responsive to the forward conduction voltage drop characteristic of the diode when conducting current, whether or not the diode will be subjected to negative differential voltages also when in use. The circuits in which the present invention is particularly suited for use may also be characterized as circuits wherein the diode or diodes will be subjected to both positive and negative differential voltages across the diode connections and the function of the diode or diodes is a power rectifying function to provide a DC or rectified current output of sufficient power level to power one or more circuits connected thereto. This is to be distinguished from applications wherein the desired function of the diode is to provide a signal-level current output which is used or processed in a subsequent circuit not powered by the DC or rectified current output of the diodes.

In many circuits of the type shown in FIG. 1, a linear voltage regulator may be used in the output in addition to smoothing capacitor 118. Further, resistor 116, which serves as a current limiting resistor, may be eliminated as a separate circuit component in favor of the secondary resistance of the transformer, as the transformer, in substantially all applications of interest, will be an actual discrete component of sufficient size to dissipate the power loss therein. Of particular importance to the present invention, however, are the diodes D1 through D4 themselves, as the power loss in these diodes in general serves no desired circuit function, but rather merely creates unwanted power dissipation and heat, requiring the use of larger diodes, whether in discrete form or integrated circuit form, and actually increases the size of the transformer required to provide this extra power output, e.g., the power required by the load plus the power dissipated by the diodes.

Figure 2A:
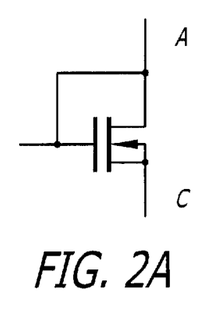
FIGS. 2A–2B are schematic diagrams of n-channel and p-channel metal oxide semiconductor field effect devices which are diode connected in accordance with the present invention.
Figure 2B:
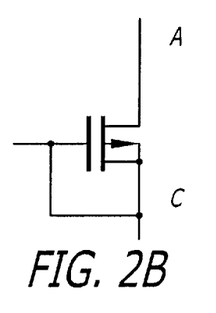
Figure 2C:
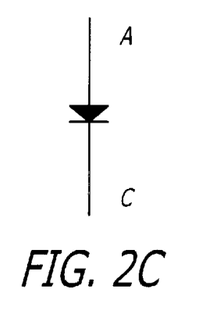
FIG. 2C is a schematic diagram of the equivalent circuit of the diode connected metal oxide semiconductor field effect devices of FIGS. 2A and 2B.

The present invention is directed to the realization of diodes and/or diode functions having low diode forward conduction voltage drops, low reverse current leakage, and high voltage capabilities for use primarily in such circuits and other circuits wherein the diodes may be or are in fact subjected to forward and reverse bias in use. This is achieved in the present invention through the use of diode connected field effect devices, shown schematically in FIGS. 2A and 2B as n-channel and p-channel diode connected field effect devices, respectively. In accordance with the preferred embodiment of the invention, such devices are fabricated through the use of common gate and drain connections, typically a common conducting layer on the substrate, and more preferably through one or more special fabrication techniques which enhance the electrical characteristic of the resulting device. FIG. 2C illustrates the equivalent diode of the diode connected field effect devices of FIGS. 2A and 2B with the respective anode "A" and cathode "C" terminals.

The present invention implements a semiconductor diode by forming one or more vertical and cylindrical shaped metal oxide semiconductor field effect transistor (MOSFET) having a diode connected configuration. One or more parallel connected vertical and cylindrical shaped metal oxide semiconductor field effect transistors (MOSFET) having a diode connected configuration are referred to as a diode configured vertical metal oxide semiconductor field effect device or devices (MOSFED).

In manufacturing the diode configured vertical MOSFED, the masking and manufacturing techniques described in U.S. patent application Ser. No. 09/689,074 entitled "METHOD AND APPARATUS FOR PATTERNING FINE DIMENSIONS" filed by Richard A. Metzler on Oct. 12, 2000 which is incorporated herein by reference can also be used to reduce the cost of masking and provide finer lines in the present invention than might otherwise be available.

Processes for fabricating embodiments of the present invention are presented herein in relation to the cross-sectional views of FIGS. 3A–3N and FIGS. 4A–4N. These exemplary processes form the diode configured vertical metal oxide semiconductor field effect devices (MOSFED) of the present invention. An individual diode configured vertical metal oxide semiconductor field effect device can be essentially thought of as a cylindrical and vertical metal oxide semiconductor field effect transistor connected with a common gate-drain connection. (In that regard, for purposes of specificity herein, the source and drain are identified in the normal forward conduction sense, it being recognized that the source and drain reverse in the case of a reverse biased device.) The diode configured vertical metal oxide semiconductor field effect devices of the present invention may also be referred to as vertical MOSFED diodes. However, the present invention is not a traditional metal oxide semiconductor field effect transistor (MOSFET) because it operates differently and is formed by a different process. As shall be subsequently seen, in a typical application a large plurality of tightly packed MOSFED devices are formed on a single substrate, all having a common gate-drain connection and a common source connection. Consequently, MOSFED as used herein may refer to a single device of multiple commonly connected devices on a single substrate.

Figures 3A, 3B:
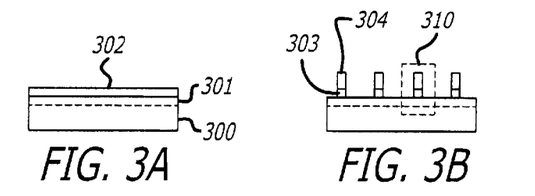

Referring now to FIGS. 3A–3N, cross-sectional views illustrating steps of an exemplary process for fabricating the diode connected vertical metal oxide semiconductor field effect devices of the present invention are illustrated. The diode connected or diode configured vertical MOSFEDs are formed using cylindrical pedestals. FIGS. 3A–3L show only a portion of a wafer illustrating the formation of a single MOSFED device. Typically, such multiple devices are simultaneously formed by replicating clusters of large numbers of commonly connected devices across larger portions or an entire semiconductor wafer. Also typically each cluster of multiple devices with incorporate some form of edge termination as is well known in the prior art to provide the breakdown voltage as needed.

FIG. 3A shows a starting silicon substrate 300 of a wafer having two silicon epitaxial layers thereon. The first silicon epitaxial layer 301, directly on top of the substrate 300, is of the same conductivity type as the substrate, and is provided in order to form an increased reverse bias breakdown voltage for diode devices. The second epitaxial layer 302, directly on top of the first layer, and forming the surface of the wafer, is of the opposite conductivity type. In one embodiment with an N-type substrate, the first silicon epitaxial layer has a resistivity of approximately 1.1 ohm-cm and a thickness of approximately 3 $\mu$m in order to achieve a reverse bias breakdown voltage of about forty-five volts. The second P-type epitaxial layer has a resistivity of 0.25 ohm-cm, 0.6 $\mu$m thick which is selected to determine the MOSFED threshold. Epitaxial wafers having the silicon epitaxial layers can be purchased as starting material, or formed as part of the processing of the diode using well known standard epitaxial growth techniques. The second epitaxial layer can be replaced by deposition or implant techniques followed by a drive thereby forming the second conductivity type in the surface of the first epitaxial layer.

In the case of an N-type silicon substrate, the lower or backside surface of the substrate 300 may form the cathode while a portion of the top surface of the substrate 300 is formed to be the anode. In the case of a P-type silicon substrate, the diode terminals are reversed and the lower or backside surface of the substrate 300 may form the anode while a portion of the top surface of the substrate 300 is formed to be the cathode.

A thin oxide layer 303 is grown on the surface of the substrate 300 as shown in FIG. 3B to randomize the sheet implant which is to follow. The thin oxide 303 is typically three hundred Angstroms (300 Å) in thickness. The sheet implant that follows requires no masking by a mask, but rather is composed of ions that are implanted over the entire wafer. The sheet implant is to provide a good ohmic contact for the P-type back gate region of the vertical MOSFED diode. The implant is a Boron implant at about $4 \times 10^{15}$ atoms per cm$^2$ with an energy of 15 KeV.

Referring again to FIG. 3B, completion of a first masking step is illustrated. Prior to the first masking step and etching, a layer of oxide is applied on top of the thin oxide 303 across the wafer. The oxide layer is then patterned using a mask and areas are etched away, including parts of the thin oxide 303 to form cylindrical shaped construction pedestals 304 on top of the thin oxide 303. The cylindrical shaped construction pedestals 304 are approximately 1.0 microns ($\mu$m) high in one embodiment. The shape of the pedestals 304 can be any cylindrical shape, including but not limited to, circular, hexagonal, square, rectangular, as well as other solid shapes such as serpentine, etc. For ease of description herein, the cylindrical shape will be presumptively rectangular forming rectangular cylindrical pedestals or bars formed out of the oxide layer. FIG. 3B illustrates a cross-section of four of a plurality of rectangular cylindrical pedestals 304 that are formed across the silicon wafer. The dimensions of the rectangular cylindrical construction pedestals 304 in one embodiment are approximately 0.15 microns in width, approximately 1.0 micron in height, with a pitch of approximately 0.4 microns. It is understood that these dimensions can be altered in coordination with any adjustment in the implantation levels in order to provide similar device physics for a diode configured vertical MOSFED. Region 310 of silicon wafer is exploded into FIG. 3C in order to further detail the processing around each of the plurality of pedestals 304.

Figure 3C:
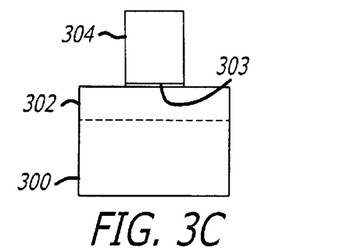

Referring now to FIG. 3C, the exploded view of region 310 of FIG. 3B is illustrated. The rectangular cylindrical construction pedestal 304 is formed on the surface of the thin oxide 303 on the substrate 300. FIGS. 3D–3L illustrate the further processing of the diode configured vertical MOSFED with respect to the rectangular cylindrical construction pedestal 304 of FIG. 3C.

Figure 3D:
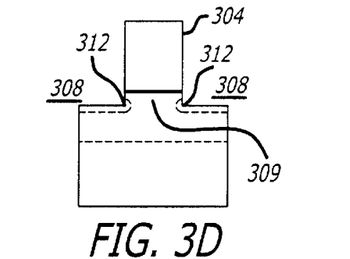

Referring now to FIG. 3D, the thin oxide layer 303 and a portion of the substrate 300 between pedestals 304 have been etched away to a depth of about 500 Å, forming shallow silicon trenches 308 and substrate pedestals 309. This etch step is a Reactive Ion Etch (RIE, a directional etch) commonly used in silicon processing to form trench metal-oxide-semiconductor (MOS) transistors and capacitors. An N-type anode contact implant is now performed, typically Arsenic, with a dose of 3E15 and energy of 15 KeV. This provides regions 312 around the periphery of each pedestal that will become the anode region (drain) at the surface of the device.

Figure 3E:
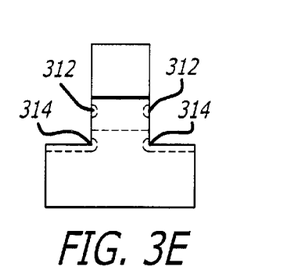

Referring now to FIG. 3E, additional silicon etching has been performed to a depth of 0.6 μm. This leaves an anode region 312 at the top of the silicon pedestal structure. This is followed by another Arsenic implant 314, with a dose of 3e14 at 15 KeV, to form the source of the FED.

Figure 3F:
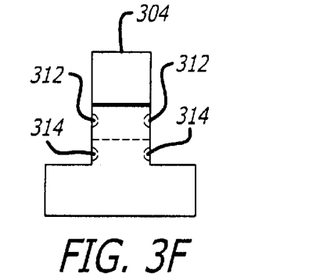

The result of a third silicon etch for another 500 Å is presented in FIG. 3F. This removes the major portion of the second implant in the bottom of the trench, leaving an isolated source implant 314 in contact with the N-type epitaxial layer if used, or to the N-type substrate if an N-type epitaxial layer is not used. This second implant is not necessary, and an alternate embodiment builds the device without this second implant and third silicon etch. This second implant may be useful however to lower the on resistance of the devices.

Figure 3G:
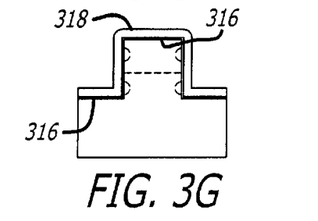

As presented in FIG. 3G, the remaining part of the oxide pedestal is stripped away, and a layer of gate oxide 316, 100 Å thick, and a layer of heavily doped poly silicon 318 are conformally deposited on the device in the first stage of the gate formation.

Figure 3H:
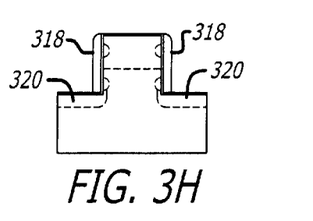

The next process is the RIE etching (a directional etch) of the poly silicon layer, stopping on the oxide layer, to form a side wall gate regions 318 shown in FIG. 3H. This is followed by a Boron implant that forms a P-type region 320 to block the potential from the bottom of the gate oxide during reverse bias (off).

Figure 3I:
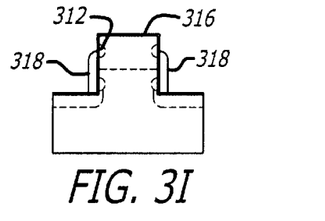
Figure 3J:
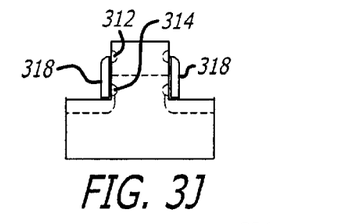
Figure 3K:
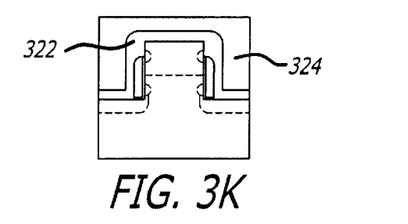

A further poly silicon RIE etch is performed as shown in FIG. 3I. This moves the top of the poly gates 318 down to allow access to the drain elements. Following this is an oxide etch to remove the gate oxide as shown in FIG. 3J. This prepares the surfaces for the application of a metal diffusion barrier 322 such as TiSi or TiW. FIG. 3K shows the finished device with a barrier metal layer 322, and a top metal layer 324 applied over the structure.

Figure 3L:
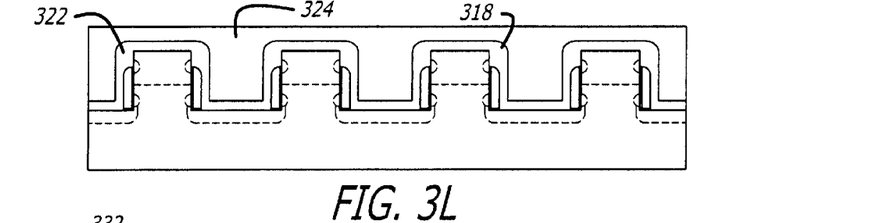
Figure 3M:
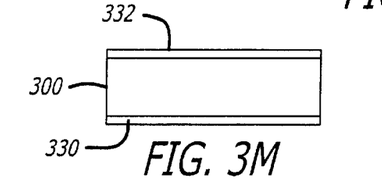
Figure 3N:
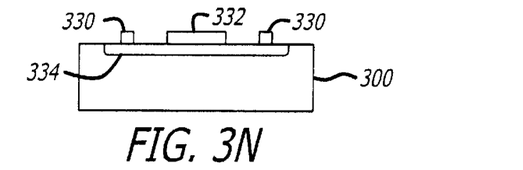

FIG. 3L presents a finished section of four pedestals with the final metal applied. Not shown however is the source contact for the device. In some applications, the source contact is made by depositing a metallization layer 330 on the back of the substrate 300 opposite the vertical MOSFED devices 332, as shown in FIG. 3M. In other applications, the vertical MOSFED devices 332 are formed in a well 334, and the source contact is made by depositing a metallization layer 330 on the well surface adjacent or surrounding the vertical MOSFED devices, as shown in FIG. 3N.

Figure 4A:
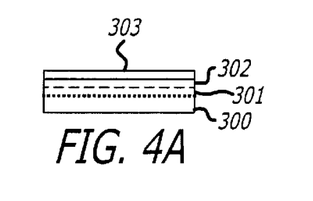
FIGS. 4A–4N are cross-sectional views illustrating steps in another exemplary process for fabricating the diode connected vertical metal oxide semiconductor field effect devices of the present invention.
Figure 4B:
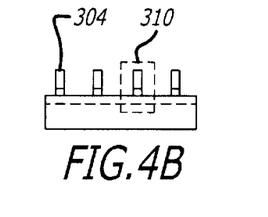
Figure 4C:
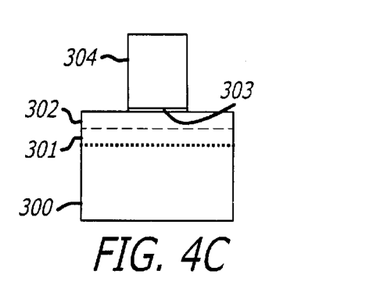
Figure 4D:
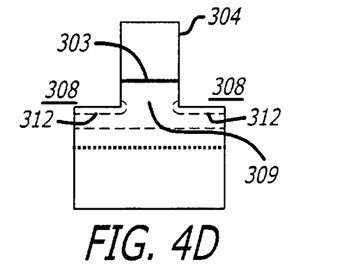
Figure 4E:
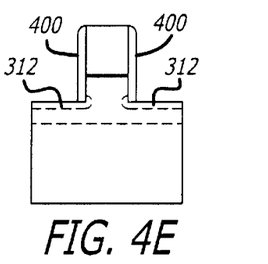
Figure 4F:
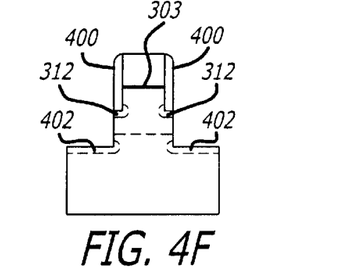
Figure 4G:
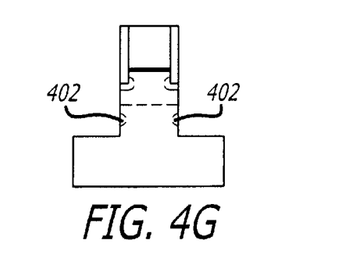
Figure 4I:
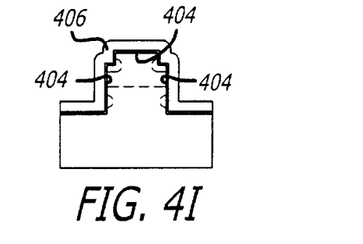

Now referring to FIGS. 4A through 4M, an alternate process for forming the MOSFEDs of the present invention may be seen. In this process, the initial steps are the same as for that described with respect to FIG. 3, specifically FIGS. 3A through 3D. Accordingly, FIGS. 4A through 4D are identical to FIGS. 3A through 3D and use the same numerical identifications. Following the n-type anode-contact implant forming regions 312 of FIG. 4D, an oxide layer is deposited and then etched back using a directional etch to leave sidewall regions 400 as shown in FIG. 4E. Thereafter, a further directional etch step is performed (FIG. 4F), followed by a further n-type, typically arsenic, implant forming n-type regions 402. A further directional etch step is then performed, leaving source regions 402 as shown in FIG. 4G. Thereafter, the oxide sidewall regions 400 are stripped away, as shown in FIG. 4H, providing greater physical access to regions 312 than in the previous embodiment. The remaining part of the oxide pedestals is also stripped away.

Figure 4J:
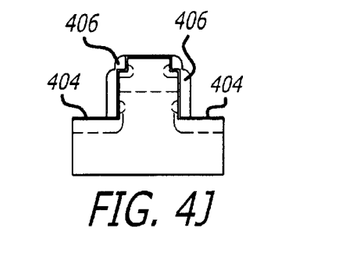
Figure 4L:
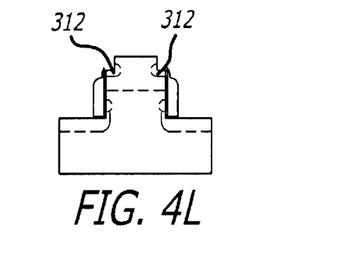
Figure 4N:
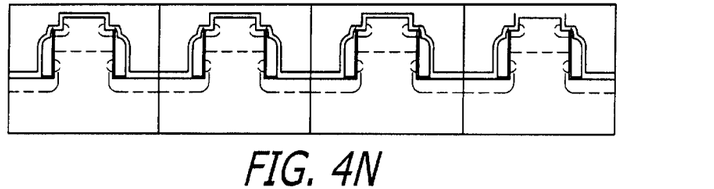

The next step is to put down a layer of gate oxide 404 and a layer of heavily doped polysilicon 406, as shown in FIG. 3I. A directional etch then removes the polysilicon from the horizontal surfaces of the oxide layer 404, leaving sidewall portions 406 as shown in FIG. 4J. Further directional etching reduces the height of the sidewall regions 406, specifically to remove the polysilicon from regions 408. Thereafter, removing the gate oxide layer from the exposed surfaces exposes regions 312, after which a diffusion barrier 410 and a top metal layer 412 are deposited to form the final structure of FIG. 4M for a single cylindrical device, or of FIG. 4N for multiple devices. As before, the source contact may be made by a metallization layer on the opposite side of the substrate, such as metallization layer 330 of FIG. 3M, or alternatively, by a metallization layer contacting a well in which the cylindrical devices are formed as in FIG. 3M.

Figure 5A:
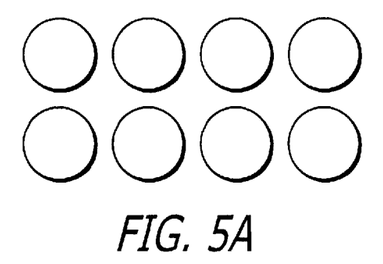
FIGS. 5A–5C are top views of exemplary alternate structures for the vertical MOSFED diode of the present invention.
Figure 5B:
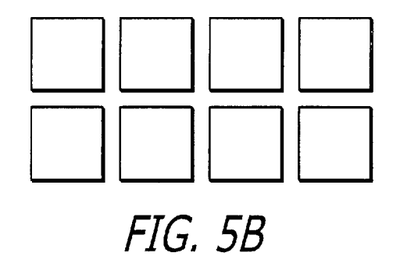
Figure 5C:
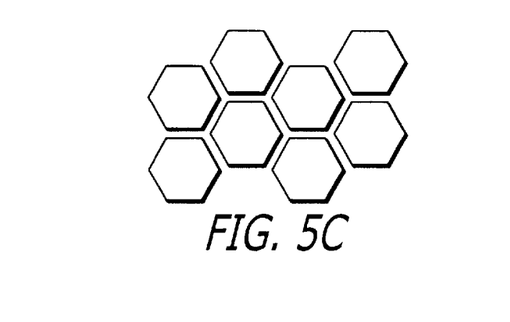

Referring now to FIGS. 5A–5C, top views of exemplary arrays of diode configured vertical MOSFEDs are illustrated. In FIG. 5A, the diode configured vertical MOSFEDs 340 are formed using circular cylindrical pedestals. In FIG. 5B, the diode configured vertical MOSFEDs 340 are formed using rectangular of square cylindrical pedestals. In FIG. 5C, the diode configured vertical MOSFEDs 340 are formed using hexagonal cylindrical pedestals. Other cylindrical shapes can be used for the pedestals in order to form different shapes of the diode configured vertical MOSFEDs 340.

Figure 6:
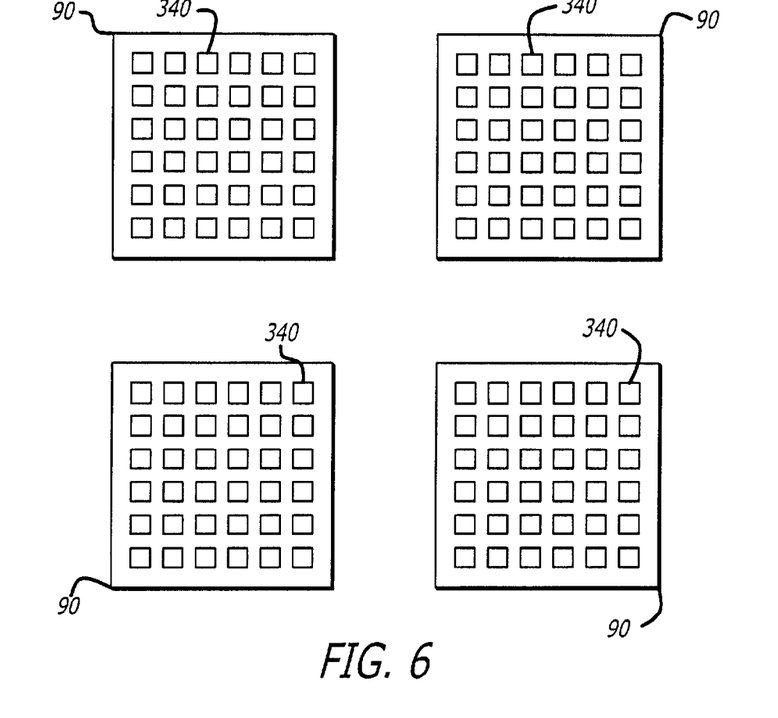
FIG. 6 illustrates active diode areas on a wafer on which a plurality of vertical MOSFED diodes are formed.

Referring now to FIG. 6, a plurality of diode active areas 90 are separated by scribe channels 91 between the diode active areas 90 on the wafer. In each diode active area 90 are a plurality of diode configured vertical MOSFEDs 340. Edge termination of the diode active areas in the scribe channels 91 can be provided through several semiconductor device terminations including the tapered termination of U.S. Pat. No. 5,825,079 entitled "Semiconductor diodes having low forward conduction voltage drop and low reverse current leakage" filed by Richard A. Metzler and Vladimir Rodov on Jan. 23, 1997 or the mesa termination described in U.S. patent application Ser. No. 09/395,722 entitled "Method and Apparatus for Termination of Semiconductor Devices" filed by Richard Metzler on Sep. 14, 1999. Additionally, well known single or multiple normal ring terminations can be used or, voltage permitting, a simple guard ring integral with the device active diffusions can be used.

Figure 7:
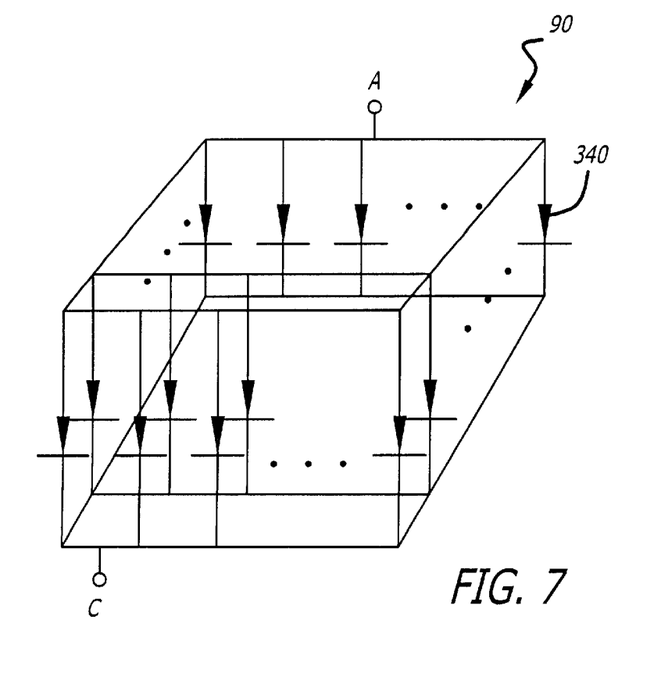
FIG. 7 is a schematic diagram of the electrical equivalent of one active diode area.

Referring now to FIG. 7, the schematic equivalent of the diode active area having multiple diodes 340 connected in parallel, each representing a diode configured vertical MOSFED. Adding the current capability of each of the diode connected vertical MOSFED devices 340 results in a large current carrying capability. It is understood that there may be several hundred or more MOSFED device active areas 90 in each cluster on a wafer, with only four being shown in FIG. 9. Each individual diode active area 90 can contain thousands of individual diode configured vertical MOSFEDs 340.

With respect to the current capability of the diode, the forward current is a function of the number of diode configured vertical MOSFEDs 340 which are coupled in parallel together.

With respect to the threshold voltage, by appropriately selecting the dopants, their concentrations, and other materials and dimensions for fabrication of the diode configured vertical MOSFED, the channel regions may be made to just conduct at substantially zero forward bias across the anode and cathode. Thus, in true rectifying applications such as in power supplies and the like, the present invention results in reduced power consumption and heating in the rectifying devices, and greater overall efficiency of the resulting circuits.

There has been disclosed herein certain exemplary methods of fabricating diode configured vertical MOSFEDs, as well as the MOSFEDs so made. It will be noted that in the exemplary processes there is a single masking step having only a trivial alignment requirement with respect to the semiconductor substrate on which the MOSFEDs are to be formed. Thereafter, each additional step is self-aligning with respect to the prior step, thereby eliminating multiple masks, and particularly the critical alignment requirement between individual masks of mask sets typically used for the fabrication of semiconductor devices. This simplifies processing, increases yields and reduces wafer to wafer device variations due to differences in mask alignment.

In certain instances in the foregoing description, certain alternate materials and methods were set forth. It is to be noted however, that the identification of specific alternative materials and processes is not to infer that still other materials and processes for those or other steps in the process of fabrication or in the resulting diode devices are excluded from use in the present invention. To the contrary, steps and materials other than those set out herein will be obvious to those skilled in the art. Thus while the present invention has been disclosed and described with respect to certain preferred embodiments, it will be understood to those skilled in the art that the present invention diodes and methods of fabricating the same may be varied without departing from the spirit and scope of the invention.

What is claimed is:

1. A method of forming a diode comprising:
   a) providing a semiconductor body of a first conductivity type having a layer of a second conductivity type on a first surface thereof;
   b) forming a plurality of cylindrical oxide pedestals on the layer of a second conductivity type;
   c) directionally etching to form trenches in the layer of second conductivity type between pedestals;
   d) forming regions of the first conductivity type in the layer of second conductivity type between pedestals and extending somewhat under the pedestals;
   e) directionally etching to form deeper trenches extending through the layer of second conductivity type between pedestals and to remove the regions of the first conductivity type in the layer of second conductivity type between pedestals and not the part of the layer of second conductivity type extending somewhat under the pedestals;
   f) depositing a gate oxide;
   g) depositing a heavily doped polysemiconductor layer;
   h) directionally etching the polysemiconductor layer to remove the polysemiconductor from the gate oxide between pedestals;
   i) implanting to convert the regions between pedestals from the first conductivity type to the second conductivity type;
   j) directionally etching to further reduce the height of the polysemiconductor layer on the gate oxide on the side walls of the pedestals to a level of the remainder of the layer of d) above;
   k) removing the exposed gate oxide;
   l) depositing a conductive layer as a first electrical contact to the diode; and,
   m) providing an electrical contact to the semiconductor body as a second electrical contact to the diode.

2. The method of claim 1 wherein the semiconductor body is a semiconductor substrate and the second electrical contact is provided by providing a metallization layer on a second surface of the substrate.

3. The method of claim 1 wherein the semiconductor body is a well in a semiconductor substrate of the second conductivity type and the second electrical contact is provided by providing an electrical contact to the well.

4. The method of claim 1 wherein the semiconductor is a silicon semiconductor.

5. The method of claim 4 wherein the semiconductor body is an N-type conductivity silicon semiconductor body.

6. A method of forming a diode comprising:
   a) forming a plurality of cylindrical semiconductor pedestals on a first surface of a semiconductor body of a first conductivity type, the pedestals having a lower region of a first conductivity type extending from the semiconductor body, an upper region of a second conductivity type forming a pn junction between the upper and lower regions of the pedestals, and a region of a first conductivity type in and extending around the upper region adjacent the pn junction;
   b) forming a gate oxide and conductive gate extending from the lower region to the region of a first conductivity type in and extending around the upper region;
   c) providing a conductive layer contacting the conductive gate and the region of a first conductivity type in and extending around the upper region; and,
   d) providing a conductive contact to the semiconductor body.

7. The method of claim 6 wherein the semiconductor body is a semiconductor substrate and the conductive contact to the semiconductor body is provided by providing a metallization layer on a second surface of the substrate.

8. The method of claim 6 wherein the semiconductor body is a well in a semiconductor substrate of the second conductivity type and the conductive contact to the semiconductor body is provided by providing an electrical contact to the well.

9. The method of claim 6 wherein the semiconductor is a silicon semiconductor.

10. The method of claim 9 wherein the semiconductor body is an N-type conductivity silicon semiconductor body.

11. A diode comprising:
- a semiconductor body of a first conductivity type;
- a plurality of cylindrical pedestals on a first surface of the semiconductor body, each having a lower region of the first conductivity type and an upper region of a second conductivity type forming a pn junction therebetween, the upper and lower regions defining sidewalls of each pedestal;
- a region of the first conductivity type around the upper region of each pedestal adjacent the pn junction;
- a gate oxide on the sidewalls of each pedestal extending from the lower region to the region of the first conductivity type around the upper region of each pedestal, part of the region of the first conductivity type around the upper region of each pedestal not being covered by the gate oxide;
- a conductive gate over the gate oxide;
- a layer of the second conductivity type between pedestals;
- a conductive layer over the plurality of cylindrical pedestals and making electrical contact with the conductive gate and the region of the first conductivity type around the upper region of each pedestal; and,
- a conductive layer making electrical contact to the semiconductor body.

12. The diode of claim 11 wherein the semiconductor body is a semiconductor substrate and the conductive layer making electrical contact to the semiconductor body is a metallization layer on a second surface of the substrate.

13. The diode of claim 11 wherein the semiconductor body is a well in a semiconductor substrate of the second conductivity type and the conductive layer making electrical contact to the semiconductor body is an electrical contact to the well.

14. The diode of claim 11 wherein the semiconductor is a silicon semiconductor.

15. The diode of claim 14 wherein the semiconductor body is an N-type conductivity silicon semiconductor body.

16. A diode comprising:
- a plurality of cylindrical semiconductor pedestals on a first surface of a semiconductor body of a first conductivity type, the pedestals having a lower region of a first conductivity type extending from the semiconductor body, an upper region of a second conductivity type and forming a pn junction between the upper and lower regions of the pedestals, and a region of a first conductivity type in and extending around the upper region adjacent the pn junction;
- a gate oxide and conductive gate extending from the lower region to the region of a first conductivity type in and extending around the upper region of each pedestal;
- a conductive layer contacting the conductive gate and the region of a first conductivity type in and extending around the upper region; and,
- a conductive contact to the semiconductor body.

17. The diode of claim 16 wherein the semiconductor body is a semiconductor substrate and the conductive contact to the semiconductor body is provided by providing a metallization layer on a second surface of the substrate.

18. The diode of claim 16 wherein the semiconductor body is a well in a semiconductor substrate of the second conductivity type and the conductive contact to the semiconductor body is provided by providing an electrical contact to the well.

19. The diode of claim 16 wherein the semiconductor is a silicon semiconductor.

20. The diode of claim 19 wherein the semiconductor body is an N-type conductivity silicon semiconductor body.

* * * * *